United States Patent
Oh et al.

(10) Patent No.: US 11,361,962 B2
(45) Date of Patent: Jun. 14, 2022

(54) METHOD AND APPARATUS FOR PROCESSING SUBSTRATE

(71) Applicant: SEMES CO., LTD., Cheonan-si (KR)

(72) Inventors: Seung Hoon Oh, Cheonan-si (KR); Jin Tack Yu, Asan-si (KR); Bu Young Jung, Cheonan-si (KR); Byung Sun Bang, Hwaseong-si (KR); Young Jin Kim, Seoul (KR); Young Jun Choi, Asan-si (KR); Jong Hyeon Woo, Asan-si (KR)

(73) Assignee: SEMES CO., LTD., Cheonan-si (KR)

( * ) Notice: Subject to any disclaimer, the term of this patent is extended or adjusted under 35 U.S.C. 154(b) by 52 days.

(21) Appl. No.: 16/673,267

(22) Filed: Nov. 4, 2019

(65) Prior Publication Data
US 2020/0144054 A1 May 7, 2020

(30) Foreign Application Priority Data
Nov. 6, 2018 (KR) .................. 10-2018-0135371

(51) Int. Cl.
*H01L 21/02* (2006.01)
*G03F 7/16* (2006.01)
*H01L 21/687* (2006.01)
*H01L 21/67* (2006.01)

(52) U.S. Cl.
CPC ........ *H01L 21/02282* (2013.01); *G03F 7/162* (2013.01); *H01L 21/67017* (2013.01); *H01L 21/687* (2013.01)

(58) Field of Classification Search
CPC ......... H01L 21/67017; H01L 21/02282; G03F 7/162
See application file for complete search history.

(56) References Cited

U.S. PATENT DOCUMENTS

| | | | | |
|---|---|---|---|---|
| 5,846,327 A | * | 12/1998 | Kawamoto | B05C 11/08 118/52 |
| 5,908,657 A | * | 6/1999 | Kimura | H01L 21/6715 427/9 |
| 6,159,541 A | * | 12/2000 | Sakai | G03F 7/162 118/52 |
| 6,207,357 B1 | * | 3/2001 | Krauth | G03F 7/168 430/327 |
| 6,248,169 B1 | * | 6/2001 | Juang | B05B 14/00 118/52 |
| 6,572,701 B2 | * | 6/2003 | Yamauchi | H01L 21/67017 118/52 |
| 6,589,338 B1 | * | 7/2003 | Nakamori | H01L 21/67051 257/E21.228 |

(Continued)

FOREIGN PATENT DOCUMENTS

JP 2007-523463 8/2007
KR 1020160008719 1/2016

*Primary Examiner* — Jarrett J Stark

(57) ABSTRACT

An embodiment of the present invention provides a substrate processing method. The substrate processing method, which performs a liquid processing process by injecting a processing liquid on a substrate on a spin chuck disposed inside a plurality of recovery cups that are disposed in multiple layers, includes: in a transitional period of time in which height change of any one of the recovery cups occurs, adjusting rotational speed of the spin chuck, which is configured to support the substrate, in conjunction with the height change of the recovery cup.

7 Claims, 4 Drawing Sheets

(56) References Cited

U.S. PATENT DOCUMENTS

| | | | |
|---|---|---|---|
| 7,837,803 B2* | 11/2010 | Hohenwarter | H01L 21/6708 134/21 |
| 8,375,887 B2* | 2/2013 | Takayanagi | H01L 21/67051 118/612 |
| 9,159,593 B2* | 10/2015 | Kawaguchi | H01L 21/67051 |
| 9,484,229 B2* | 11/2016 | Lach | H01L 21/67051 |
| 9,698,029 B2* | 7/2017 | Schwarzenbacher | H01L 21/6715 |
| 9,779,979 B2* | 10/2017 | Schwarzenbacher | H01L 21/67051 |
| 10,068,763 B2* | 9/2018 | Yoshihara | B05C 11/08 |
| 10,490,427 B2* | 11/2019 | Choi | H01L 21/67051 |
| 2002/0066475 A1* | 6/2002 | Verhaverbeke | B25B 5/06 134/902 |
| 2002/0112662 A1* | 8/2002 | Yamauchi | H01L 21/67017 118/52 |
| 2003/0196986 A1* | 10/2003 | Tsung-Kuei | H01L 21/67115 216/2 |
| 2004/0050491 A1* | 3/2004 | Miya | H01L 21/67051 156/345.11 |
| 2006/0182882 A1* | 8/2006 | Takahashi | G11B 7/266 |
| 2007/0264007 A1* | 11/2007 | Kitahara | G03F 7/3021 396/518 |
| 2008/0110861 A1 | 5/2008 | Kajita et al. | |
| 2009/0162547 A1* | 6/2009 | Sawada | H01L 21/6715 118/320 |
| 2012/0162618 A1* | 6/2012 | Tokumaru | G03F 7/3021 355/27 |
| 2012/0238106 A1* | 9/2012 | Chuang | G03F 7/162 438/758 |
| 2014/0238443 A1* | 8/2014 | Lee | H01L 21/6708 239/548 |
| 2014/0299161 A1* | 10/2014 | Tanaka | B08B 3/024 134/30 |
| 2016/0336170 A1* | 11/2016 | Ishida | H01L 21/02041 |
| 2018/0361428 A1* | 12/2018 | Yoshihara | B05D 3/107 |
| 2019/0366394 A1* | 12/2019 | Yoshida | H01L 21/67051 |

* cited by examiner

METHOD AND APPARATUS FOR PROCESSING SUBSTRATE

CROSS REFERENCE TO RELATED APPLICATION

The present application claims priority under 35 U.S.C. § 119 to Korean Patent Application No. 10-2018-0135371, filed Nov. 6, 2018 in the Korean Intellectual Property Office, the disclosure of which is incorporated by reference herein in its entirety.

BACKGROUND OF THE INVENTION

Field of the Invention

The present invention relates generally to a substrate processing method and a substrate processing apparatus that are capable of preventing contamination of a chemical liquid recovery cup.

Description of the Related Art

Generally, a semiconductor device is manufactured by depositing various materials on a substrate in a thin film plate and patterning the deposited materials. To this end, different substrate processing processes in several steps such as photolithography and thin film formation are required. In each of processing processes, the substrate may be processed by being mounted to a chamber that provides optimum conditions for the process.

FIG. 1 is a plane view showing a general system of processing a substrate.

Referring to FIG. 1, the substrate processing system includes an index module 10 and a process module 20.

The substrate is a comprehensive term including a silicon wafer, a glass substrate, an organic substrate, and the like.

The index module 10 receives the substrate from the outside and transports the substrate to the process module 20. The index module 10 includes a load chamber 11 and a transfer frame 12.

A container 11a accommodating the substrate is placed in the load chamber 11. As the container 11a, a front opening unified pod (FOUP) may be used. The container 11a may be brought into or out of the load chamber 11 from the outside by an overhead transfer (OHT).

The transfer frame 12 transports the substrate from the container 11a placed in the load chamber 11 to the process module 20. The transfer frame 12 includes an index robot 12a and an index rail 12b. The index robot 12a may transport the substrate by moving the same on the index rail 12b. For example, the index robot 12a may take out the substrate from the container 11a and place the substrate in a buffer slot to be described later.

The process module 20 includes a buffer chamber 21, a transfer chamber 22, and a process chamber 23.

The buffer chamber 21 provides space for the substrate transported from the index module 10 to the process module 20 to temporarily stop. The buffer chamber 21 may have a buffer slot 21a on which the substrate is placed. The buffer slot 21a may be provided as a plurality of buffer slots, and thus a plurality of substrates may also be introduced into the buffer chamber 21.

The transfer chamber 22 transports the substrate between the buffer chamber 21 and the process chamber 23 disposed around the transfer chamber. The transfer chamber 22 includes a transfer robot 22a and a transfer rail 22b. The transfer robot 22a may transfer the substrate while being moved on the transfer rail 22b. That is, the transfer robot 22a of the transfer chamber 22 may take out the substrate placed on the buffer slot 21a and transport the substrate to the process chamber 23.

The process chamber 23 may be provided as one or a plurality of process chambers. The process chamber 23 has an entrance through which the substrate enters and exits, and the entrance may be opened and closed by a door. The process chamber 23 may be disposed such that one side provided with the entrance faces the transfer chamber 22.

The process chamber 23 performs a predetermined process on the substrate. For example, the process chamber 23 may perform processes such as photoresist applying, developing, cleaning, and heat treatment.

Meanwhile, foreign matter such as particles, organic contaminants, and metal contaminants remaining on a surface of the substrate has a great effect on characteristic and production yield of the semiconductor device. For this reason, a cleaning process removing a variety of foreign matter on the substrate surface is very important in the semiconductor manufacturing process, and the cleaning process for the substrate is performed at the front and rear steps of each unit process of manufacturing the semiconductor device.

Generally, the cleaning process includes: a chemical liquid process to remove metal foreign matter, organic matter, particles, or the like remaining on the substrate using a chemical liquid; a rinse process to remove the chemical liquid remaining on the substrate using purified water (de-ionized water, DIW); and a drying process to dry the substrate using a drying processing liquid and/or a drying gas.

The cleaning process is performed by supplying a processing liquid to the substrate. A plurality of top-opening recovery cups is provided in multiple layers outside the substrate, and each of recovery cups is moved up and down correspondingly during the chemical liquid process, the rinse process, and the dry process.

When the cleaning process is performed, the substrate is typically rotated, and a processing liquid supplied to the substrate is scattered into one of the recovery cups by a centrifugal force when the substrate is rotated. However, as a processing liquid is discharged from a previous process, a recovery cup other than a recovery cup corresponding the processing liquid may be contaminated by the processing liquid.

Documents of Related Art (Patent Document 1) Korean Patent Application Publication No. 10-2010-0060094.

SUMMARY OF THE INVENTION

Accordingly, the present invention has been made keeping in mind the above problems occurring in the related art, and the present invention is intended to propose a substrate processing apparatus and a substrate processing method, wherein when a substrate is processed by a chemical liquid, contamination of a recovery cup to be used in a later process due to a chemical liquid discharged from a previous process is prevented.

The objective of the present invention is not limited to the foregoing, and other objectives and advantages of the present invention which are not mentioned may be understood by the following description.

In order to achieve the above object, according to one aspect of the present invention, there is provided a substrate processing method. As the substrate processing method performs a liquid processing process by injecting a processing liquid onto a substrate on a spin chuck disposed inside a plurality of recovery cups that are disposed in multiple layers, in a transient period of time in which height change of any one of the recovery cups is performed, the substrate processing method according to the embodiment of the present invention may adjust rotational speed of the spin chuck in conjunction with the height change of the recovery cup, the spin chuck being configured to support the substrate.

When the height change of the recovery cup occurs, the rotational speed of the spin chuck may be temporarily reduced.

The transient condition may be one of conditions in which the number of stages of the recovery cups is changed, a type of the injected processing liquid is changed, or supply of the processing liquid is stopped.

The liquid processing process may include: a first period of time in which foreign matter remaining on the substrate is removed using a chemical liquid and the spin chuck is rotated at a first speed; a second period of time in which the chemical liquid applied to the substrate is cleaned using a rinse liquid and the spin chuck is rotated at a second speed; and a third period of time in which the rinse-processed substrate is dried and the spin chuck is rotated at a third speed. Wherein, the rotational speed of the spin chuck may be gradually increased during the second period of time.

The liquid processing process may further include: between the first period of time and the second period of time, a first transient period of time in which the spin chuck is rotated at a first adjustment speed slower than the first speed; and between the second period of time and the third period of time, a second transient period of time in which the spin chuck is rotated at a second adjustment speed slower than the second speed.

A substrate processing apparatus according to an embodiment of the present invention may include: a support unit having a spin chuck that is configured to support and rotate the substrate; an injection unit injecting a processing liquid onto the substrate; a recovery unit having a plurality of recovery cups provided outside the spin chuck and disposed in multiple layers, and the recovery unit recovering at least one type of processing liquid processing the substrate; and a control unit controlling the support unit, the injection unit, and the recovery unit. Wherein the control unit may control the injection unit, so that the injection unit may inject the processing liquid onto the substrate on the spin chuck that is rotated at preset speed, and then the spin chuck may be rotated at adjustment speed slower than the preset speed when relative heights of the spin chuck and the recovery unit are changed. When the relative heights of the spin chuck and the recovery unit are changed, any one of the multiple-layered recovery cups may descend.

The recovery cups may include a first recovery cup recovering a first processing liquid, a second recovery cup recovering a second processing liquid, and a third recovery cup recovering a third processing liquid. An inclined portion may be provided on an upper portion of each of the recovery cups, and the inclined portion may be inclined upwardly in a direction of the spin chuck.

According to the embodiment of the present invention, in the transitional period of time of the liquid processing process in which a height of the recovery cup is changed, it is possible to minimize delay in overall process speed by selectively reducing rotational speed of the spin chuck in conjunction with the height change of the plurality of recovery cups, and to easily maintain cleanliness of the recovery cups.

Effects of the present invention are not limited to the above effect, and should be understood to include all effects inferred from the configuration of the present invention described in the detailed description or the accompanying claims.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
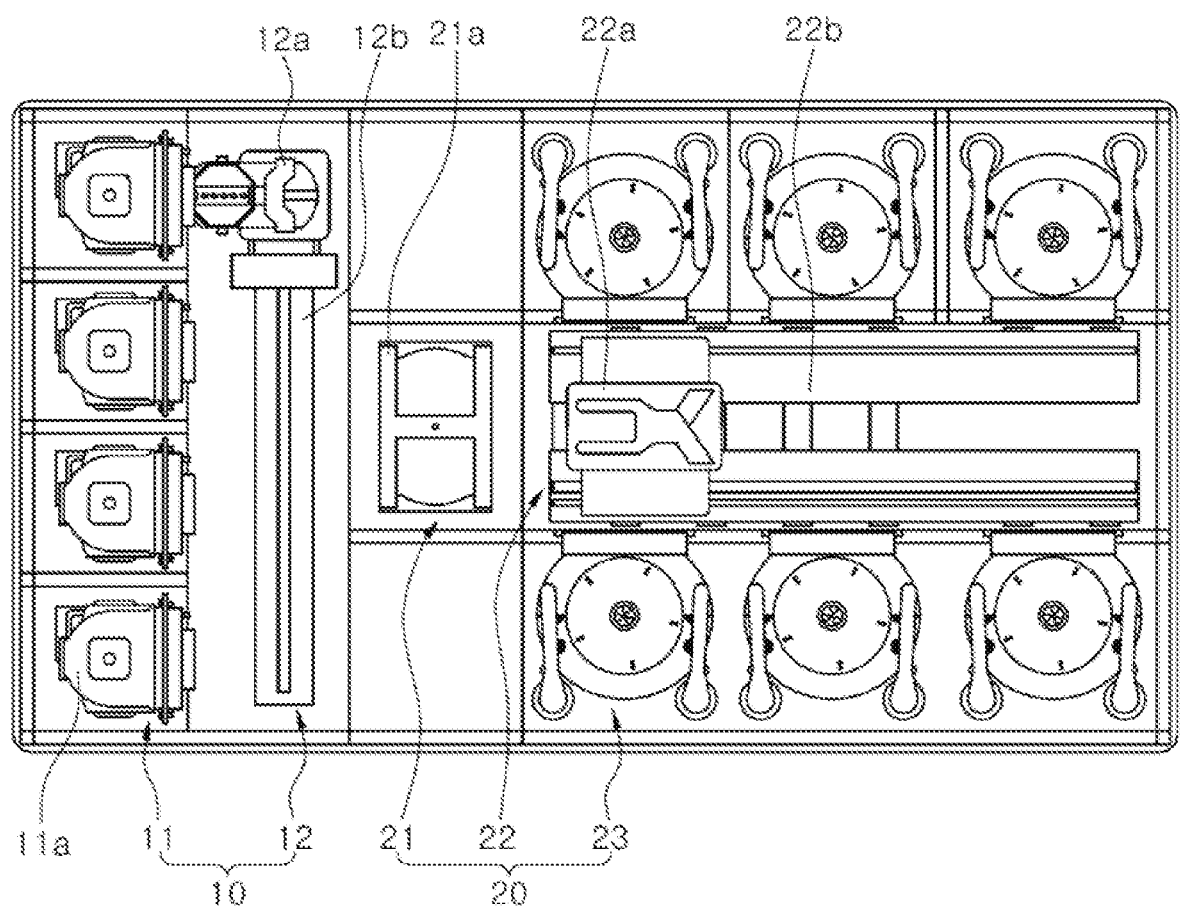
FIG. 1 is a plane view showing a conventional substrate processing system.

Hereinbelow, the exemplary embodiment of the present invention will be described in detail with reference to the accompanying drawings. Various changes to the embodiment of the invention are possible, and the scope of the invention is not limited to the embodiment described below.

In order to clearly describe the present invention, elements incorporated herein will be omitted when it may make the subject matter of the present invention unclear, and the same reference numerals will be used throughout the specification to refer to the same or like elements or parts.

In the specification, when an element is referred to "include" another element, it will be understood that it may "further include" the other element rather than "exclude" the other element unless otherwise defined. All terms used herein are for describing the particular embodiment only and is not intended to limit the present invention. Unless otherwise defined, the terms may have the same meaning as commonly understood by one of ordinary skill in the art to which the present invention belongs.

Figure 2:
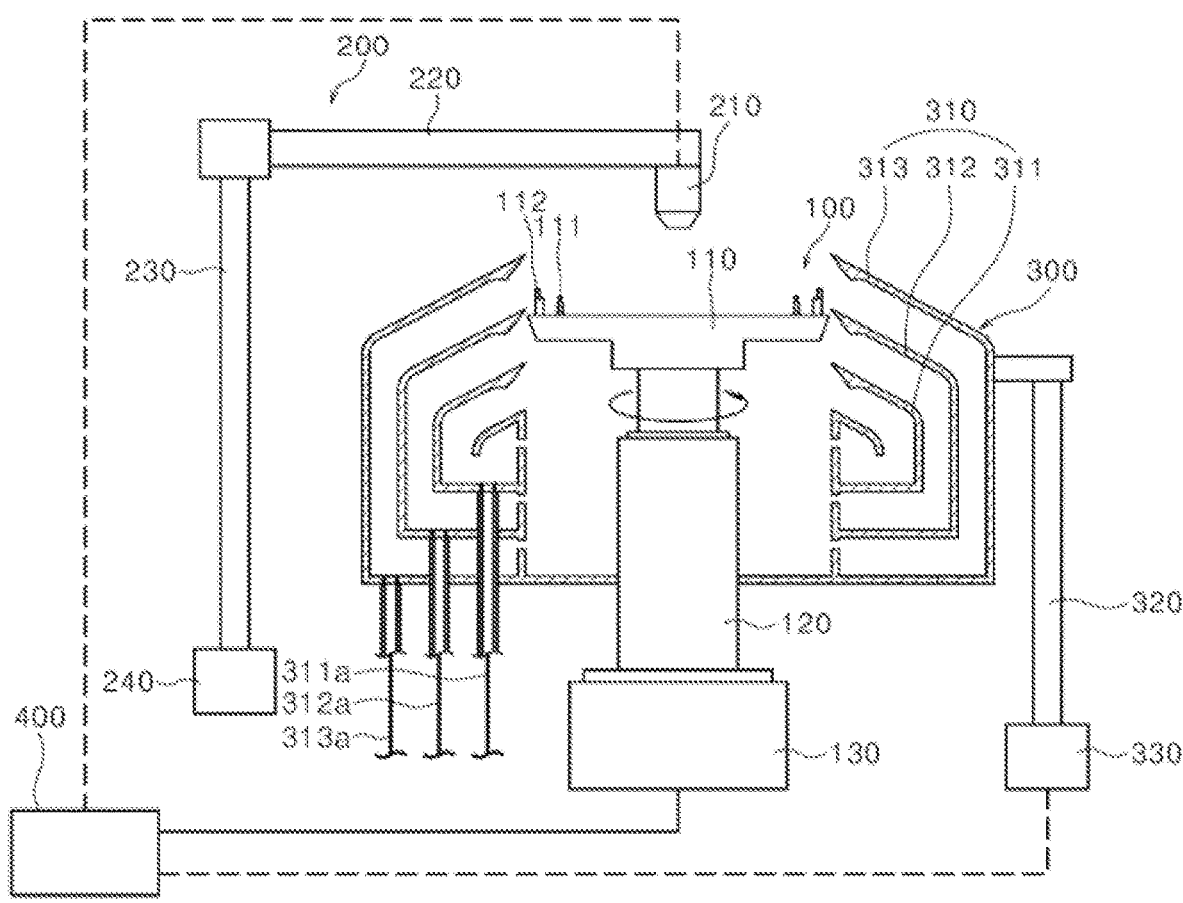
FIG. 2 is a sectional view showing a substrate processing apparatus according to an embodiment of the present invention.

FIG. 2 is a sectional view showing a substrate processing apparatus according to an embodiment of the present invention.

Referring to FIG. 2, the substrate processing apparatus includes a support unit 100, an injection unit 200, a recovery unit 300, and a control unit 400.

The support unit 100 may support a substrate, and rotate the supported substrate. The support unit 100 may include a spin chuck 110, a rotational shaft 120, and a first driving part 130.

The spin chuck 110 may have a shape that is the same or similar to a shape of the substrate. For example, the spin chuck 110 may be formed in a shape of a circular flat plate. The spin chuck 110 has a support pin 111 and a chuck pin 112 on an upper surface thereof. The support pin 111 supports a lower surface of the substrate. The chuck pin 112 supports a side surface of the substrate to prevent the substrate from being displaced from a regular position of the substrate.

The rotational shaft 120 is connected to a lower side of the spin chuck 110. The rotational shaft 120 rotates the spin chuck 110 by receiving a rotational force of the first driving part 130. Thus, the substrate seated on the spin chuck 110 may be rotated.

The injection unit 200 injects a processing liquid onto the substrate. The processing liquid may be at least one of a chemical liquid for a certain process, a rinse liquid for rinsing the chemical liquid, and a drying liquid for drying the rinse liquid. The injection unit 200 includes an injection nozzle 210, a nozzle arm 220, a first raising shaft 230, and a second driving part 240.

The injection nozzle 210 injects the processing liquid onto the substrate seated on the spin chuck 110. The injection nozzle 210 may be positioned at a position above the center of the substrate. The injection nozzle 210 is provided on a lower surface of the nozzle arm 220. The nozzle arm 220 is coupled to the raiseable and rotatable first raising shaft 230. The second driving part 240 may control a position of the injection nozzle 210 by raising or rotating the first raising shaft 230.

The recovery unit 300 recovers the processing liquid supplied to the substrate. When the processing liquid is supplied to the substrate by the injection unit 200, the support unit 100 may rotate the substrate to allow the processing liquid to be applied evenly over entire area of the substrate. When the substrate is rotated during the process, the processing liquid applied to the substrate is scattered out of the substrate by a centrifugal force of the rotated substrate. The processing liquid scattered out of the substrate may be recovered by the recovery unit 300. The recovery unit 300 includes a recovery cup 310, a recovery line, a second raising shaft 320, and a third driving part 330.

The recovery cup 310 may be formed in a top opening cylindrical shape around a circumference of the spin chuck 110. The recovery cup 310 may be provided as a plurality of recovery cups in multiple layers each having a different diameter. For example, the recovery cups may be disposed from the inside in the order of a first recovery cup 311, a second recovery cup 312, and a third recovery cup 313. Each of the recovery cups 311, 312, and 313 may recover one of the processing liquids differently used in the processes.

The plurality of recovery cups 311, 312, and 313 may be disposed in multiple layers so that heights thereof may be different from each other. For example, in the plurality of recovery cups 311, 312, and 313, a recovery cup farther away from the spin chuck 110 may be disposed to have a higher height. That is, the first recovery cup 311 may have a lowest height, and the third recovery cup 313 may have a highest height.

Each of the recovery cups 311, 312, and 313 may have an inclined portion on an upper portion thereof. The inclined portion is inclined in a direction inward the recovery cup, that is, inclined upwardly in a direction of the spin chuck 110. The inclined portion may prevent the processing liquid scattered out of the substrate from being discharged toward an open upper side of the recovery cup.

The recovery cups are respectively connected with recovery lines 311a, 312a, and 313a in lower side directions thereof. Each of recovery lines 311a, 312a, and 313a recovers the processing liquid flowing through each of recovery cups 311, 312, and 313. The recovered processing liquid may be reused by a reuse system.

The second raising shaft 320 is connected to the recovery cups. The second raising shaft 320 moves the recovery cups up and down by power received from the third driving part 330. Each of recovery cups may be raised and may descend separately from each other. As the recovery cup is moved up and down, a relative height of the recovery cup to the support unit 100 is changed.

The third driving part 330 provides power to the second raising shaft 320 for raising or lowering the recovery cups. That is, the third driving part 330 may raise the recovery cups through the second raising shaft 320 so that each of the recovery cups is adjusted to a height required for the process.

Accordingly, when the substrate may be placed on the support unit 100 or may be raised from the support unit 100, the recovery cup descends so that the support unit 100 protrudes higher than a height of the recovery cup. In addition, during the process, a height of the recovery cup is adjusted so that a processing liquid may be introduced into a preset recovery cup according to a type of the processing liquid supplied to the substrate. For example, the first recovery cup 311 may be positioned to correspond to a height of the substrate, while the substrate is processed by a first processing fluid. Then, when the substrate is processed by a second processing fluid, the first recovery cup 311 descends and the second recovery cup 312 is positioned to correspond to the height of the substrate. In addition, when the substrate is processed by a third processing fluid, the second recovery cup 312 descends and the third recovery cup 313 is positioned to correspond to the height of the substrate.

Meanwhile, each of the recovery cups may be raised separately. Since the recovery cups according to the embodiment are disposed at different heights, all of the recovery cups may be raised to correspond to the height of the substrate during the process. In addition, the recovery cup is configured to be raised up and down in the embodiment, but the spin chuck 110 may be configured to be moved up and down so that the height of the substrate corresponds to the recovery cups.

The control unit 400 controls the support unit 100, the injection unit 200, and the recovery unit 300. That is, the control unit 400 may control rotational speed of the spin chuck 110, the operation of the injection nozzle 210, and the raising of the recovery cup.

The control unit 400 is configured to allow the injection unit 200 to supply the processing liquid directly on an upper surface of the spin chuck 110.

The control unit 400 rotates the spin chuck 110 at second speed after the processing liquid is supplied in a state where the spin chuck 110 is rotated at first speed. The second speed may be controlled faster than the first speed. In addition, the control unit 400 may stop the supply of the processing liquid to the spin chuck 110 during the rotation of the spin chuck 110 at the second speed.

The control unit 400 controls the recovery unit 300. A height of the recovery cup may be adjusted up and down, depending on the process. That is, a relative height of the recovery cup to a height of the upper surface of the spin chuck 110 may be adjusted, and a height of the recovery cup may be adjusted in consideration of a path of the processing liquid scattered out of the upper surface of the spin chuck 110. For example, after the spin chuck 110 is rotated at preset speed required for the process, the rotational speed of the spin chuck 110 may be reduced to adjustment speed slower than the preset speed, and any one of the multiple-layered recovery cups may descend.

Figure 3:
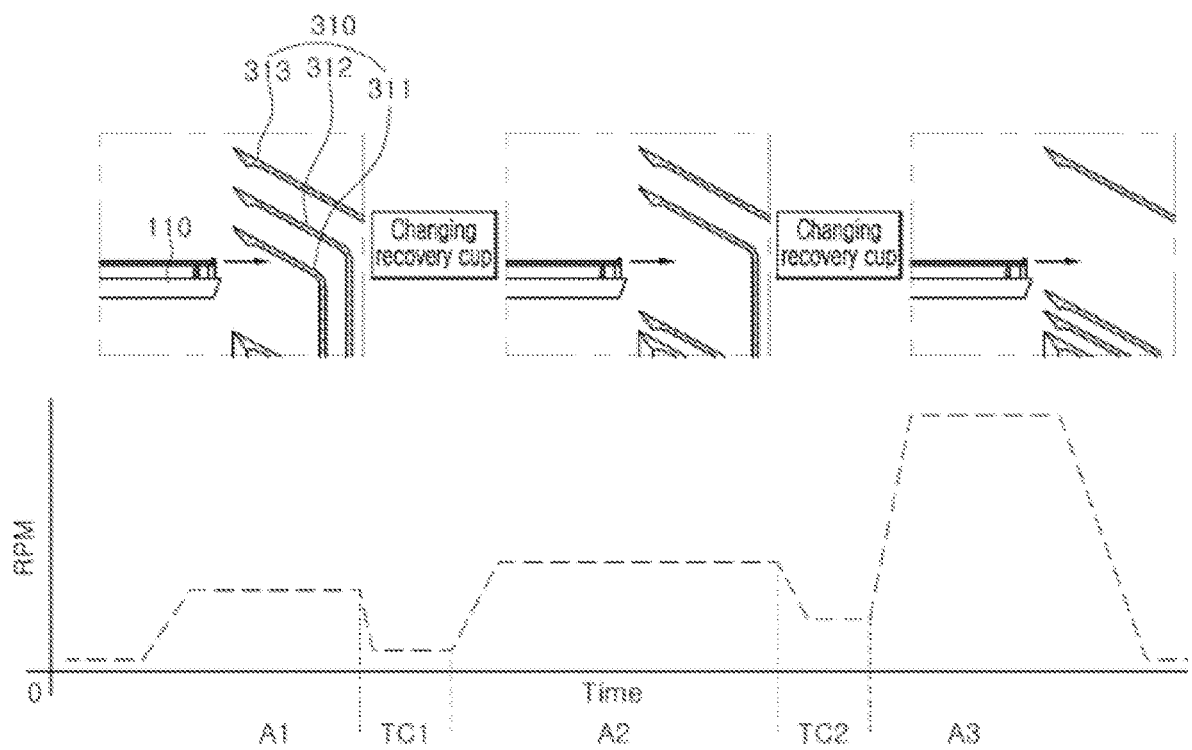
FIG. 3 is a view showing an operational process of the substrate processing apparatus according to the embodiment of the present invention.
Figure 4:
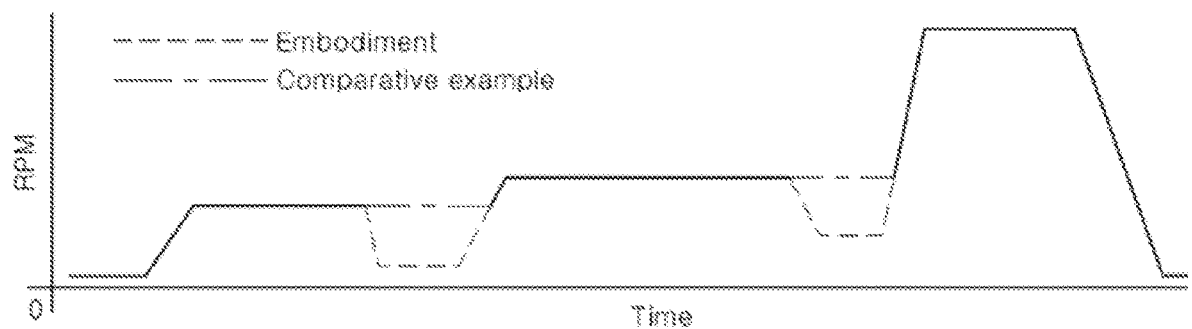
FIG. 4 is a graph showing the embodiment and a comparative example of the present invention.

FIG. 3 is a view showing a process of processing the substrate according to the present invention. FIG. 4 is a graph showing the embodiment and a comparative example of the present invention.

Referring to FIGS. 3 and 4, a substrate processing method according to the embodiment includes: changing a height of the recovery cup in a transient condition during the substrate processing process; and adjusting rotational speed of the spin chuck 110 configured to support the substrate in conjunction with the height change of the recovery cup. In the transient condition during the substrate processing process, along with the height change of the recovery cup, an injection nozzle for the processing liquid may be changed and the supply of the processing liquid may be stopped. In addition, the rotational speed of the spin chuck 110 may be temporarily reduced in the transient condition.

For example, the substrate processing method according to the embodiment may include a first period of time A1, a second period of time A2, and a third period of time A3.

The first period of time A1 is a period in which a first processing liquid is applied to the substrate. In the first period of time A1, the first processing liquid is injected onto the substrate on the spin chuck 110 rotated at the first speed, and the first recovery cup 311 is positioned at a height corresponding to the height of the substrate. For example, the first period of time A1 may be a chemical processing period for removing metal foreign matter, organic matter, particles, or etc. remaining on the substrate using a chemical liquid.

The second period of time A2 is a period in which a second processing liquid is applied to the substrate. In the second period of time A2, the second processing liquid is injected onto the substrate on the spin chuck 110 rotated at the second speed, and the second recovery cup 312 is positioned at the height corresponding to the height of the substrate. For example, the second period of time A2 may be a rinse processing period for cleaning the chemical liquid applied to the substrate using the rinse liquid such as purified water (de-ionized water, DIW).

In the second period of time A2, rotational speed of the spin chuck 110 may be gradually increased without being maintained constantly. For example, when rotational speed of the spin chuck 110 is gradually changed to high speed, DIW may be scattered out of the substrate all over an inner wall of the second recovery cup 312, thus cleaning the entire inner wall of the second recovery cup 312.

In the third period of time A3, a third processing liquid is injected onto the substrate on the spin chuck 110 rotated at a third speed, and the third recovery cup 313 is positioned at the height corresponding to the height of the substrate. The third period of time A3 may be a period for drying the rinsed substrate. In order to dry the substrate, a third processing liquid such as a drying processing liquid for drying the rinse liquid may be provided. As the drying processing liquid, for example, isopropyl alcohol (IPA) may be applied. In the third period of time A3, the drying process may be performed by supplying a drying gas such as nitrogen gas (N2) to the substrate together with the drying processing liquid.

A first transient time period TC1 is provided in transient condition from the first period of time A1 to the second period of time A2. In the first transient time period TC1, the first processing liquid injection from the injection unit 200 is stopped, and the first recovery cup 311 descends to recover the first processing liquid. Thus, the second recovery cup 312 disposed outside the first recovery cup 311 is positioned at the height corresponding to the height of the substrate.

Meanwhile, even when the first processing liquid injection is stopped in the first transient time period TC1, a predetermined amount of the first processing liquid may remain on the substrate. The remaining first processing liquid may be scattered into the recovery unit 300 by the rotation of the substrate and may contaminate the second recovery cup 312. Accordingly, in the embodiment, since the rotational speed of the spin chuck 110 at the first transient time period TC1 is reduced to a first adjustment speed slower than the first speed, a scattering distance of the first processing liquid applied to the substrate is reduced according to the reduced rotational speed of the spin chuck 110. As a result, even when the first processing liquid remaining on the substrate is scattered into the recovery unit 300, the first processing liquid may only be recovered to the descending first recovery cup 311 and not to the second recovery cup 312. Accordingly, the second recovery cup 312 may be prevented from being unnecessarily contaminated.

However, as shown in the comparative example of FIG. 4, when the rotational speed of the spin chuck 110 is maintained at the first speed without deceleration in a state where the first recovery cup 311 descends, the first processing liquid remaining on the substrate maintains the scattering path thereof and may be scattered into not only the first recovery cup 311 but also the second recovery cup 312. Thus, the first processing liquid and the second processing liquid are mixed in the second recovery cup 312 that is for recovering the second processing liquid in a later process, thereby contaminating the second recovery cup 312.

A second transient time period TC2 is provided in a transient condition from the second period of time A2 to the third period of time A3. The second recovery cup 312 for recovering the second processing liquid descends in the second transient time period TC2. Thus, the third recovery cup 313 disposed outside the second recovery cup 312 is positioned at the height corresponding to the height of the substrate. In the embodiment, the rotational speed of the spin chuck 110 is reduced to a second adjustment speed slower than the second speed, so that a scattering distance of the second processing liquid applied to the substrate is reduced according to the reduced rotational speed of the spin chuck 110. As a result, the second processing liquid drops into the second recovery cup 312 and may not be scattered into the third recovery cup 313. Accordingly, the third recovery cup 313 may be prevented from being unnecessarily contaminated.

However, as shown in the comparative example of FIG. 4, when the rotational speed of the spin chuck 110 is maintained at the second speed without deceleration in a state where the second recovery cup 312 descends, the second processing liquid applied to the substrate may be scattered into not only the second recovery cup 312 but also the third recovery cup 313. Thus, the second processing liquid and the third processing liquid are mixed in the third recovery cup 313 that is for recovering the third processing liquid in a later process, thereby contaminating the third recovery cup 313.

Since the present invention may be embodied in other specific forms without changing the technical sprit or essential features, those skilled in the art to which the present invention belongs should understand that the embodiment described above are exemplary and not intended to limit the present invention.

The scope of the present invention will be defined by the accompanying claims rather than by the detailed description, and those skilled in the art should understand that various modifications, additions and substitutions derived from the meaning and scope of the present invention and the equivalent concept thereof are included in the scope of the present invention.

What is claimed is:

1. A substrate processing method, in which a liquid processing process is performed by injecting a processing liquid onto a substrate on a spin chuck disposed inside a plurality of recovery cups that are disposed in multiple layers, the spin chuck being configured to support the substrate, the substrate processing method comprising:

injecting, during a first time, a first processing liquid onto the substrate which is disposed on the spin chuck positioned at a first height and rotating at a first rotation speed, wherein during the first time, a first recovery cup is positioned at the first height and collects a portion of the first processing liquid scattered from the substrate;

moving, during a first transient period after the first time, a second recovery cup to the first height where the first recovery cup was positioned during the first time, wherein during the first transient period, a rotation speed of the spin chuck is being reduced from the first rotation speed to a first adjustment speed which is slower than the first rotation speed, the first adjustment speed being greater than zero;

injecting, during a second time immediately after the first transient period, a second processing liquid, different from the first processing liquid, onto the substrate which is disposed on the spin chuck positioned at the first height, wherein during the second time, the second recovery cup is positioned at the first height to collect a portion of the second processing liquid scattered from the substrate, wherein a rotation speed of the spin chuck is increasing from the first adjustment speed to a second rotation speed greater than the first rotation speed, wherein during a portion of the second time, the rotation speed of the spin chuck is increasing from the first adjustment speed to the second rotation speed, and wherein during the remaining time of the second time, the spin chuck rotates at the second rotation speed;

moving, during a second transient period after the second time, a third recovery cup to the first height where the second recovery cup was positioned during the second time, wherein during the second transient period, the rotation speed of the spin chuck is being reduced from the second rotation speed to a second adjustment speed which is slower than the second rotation speed, the lowest speed of the second adjustment speed being greater than the lowest speed of the first adjustment speed; and injecting, during a third time after the second transient period, a third processing liquid onto the substrate to dry the substrate, wherein during the third time, the spin chuck rotates at a third rotation speed which is greater than the second adjustment speed.

2. The substrate processing method of claim 1, wherein in the first transient period the injecting of the first processing liquid is stopped.

3. The substrate processing method of claim 1, wherein in the injecting of the first processing liquid, foreign matter remaining on the substrate is removed using the first processing liquid, and wherein the second processing liquid is de-ionized water and in the injecting of the second processing liquid, the substrate applied with the first processing liquid is cleaned using the second processing liquid.

4. The substrate processing method of claim 1, wherein the third processing liquid is isopropyl alcohol (IPA).

5. The substrate processing method of claim 1, wherein the third rotation speed is faster than the second rotation speed.

6. The substrate processing method of claim 1, wherein during the second transient period, the rotation speed of the spin chuck is being increased from the second adjustment speed to the third rotation speed.

7. The substrate processing method of claim 4, supplying nitrogen gas (N2) to the substrate during a time when the third processing liquid is being injected.

* * * * *